US011587763B2

(12) United States Patent
Akimoto

(10) Patent No.: US 11,587,763 B2
(45) Date of Patent: Feb. 21, 2023

(54) SUBSTRATE PROCESSING SYSTEM, SWITCHING TIMING CREATION SUPPORT DEVICE, SWITCHING TIMING CREATION SUPPORT METHOD, AND SUBSTRATE PROCESSING APPARATUS

(71) Applicant: Tokyo Electron Limited, Tokyo (JP)

(72) Inventor: Takeshi Akimoto, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 189 days.

(21) Appl. No.: 17/185,098

(22) Filed: Feb. 25, 2021

(65) Prior Publication Data

US 2021/0272772 A1 Sep. 2, 2021

(30) Foreign Application Priority Data

Feb. 28, 2020 (JP) .............................. JP2020-033699

(51) Int. Cl.
*H01J 37/305* (2006.01)
*H01J 37/317* (2006.01)
*H01J 37/304* (2006.01)
*H01J 37/32* (2006.01)

(52) U.S. Cl.
CPC ...... *H01J 37/3056* (2013.01); *H01J 37/3045* (2013.01); *H01J 37/3174* (2013.01); *H01J 37/32963* (2013.01); *H01J 37/32972* (2013.01); *H01J 2237/31744* (2013.01)

(58) Field of Classification Search
CPC ............... H01J 37/3056; H01J 37/3045; H01J 37/3174; H01J 37/32963; H01J 37/32972; H01J 2237/3174; H01J 2237/30466
See application file for complete search history.

(56) References Cited

U.S. PATENT DOCUMENTS 8,193,007 B1 * 6/2012 Madriaga .......... H01L 21/67069
257/E21.528
10,510,519 B2 * 12/2019 Asakura ............ H01J 37/32972
(Continued)

FOREIGN PATENT DOCUMENTS

JP 07-50289 A 2/1995

*Primary Examiner* — David E Smith
(74) *Attorney, Agent, or Firm* — Nath, Goldberg & Meyer; Jerald L. Meyer; Tanya E. Harkins

(57) ABSTRACT

A substrate processing system includes a substrate processing apparatus and a switching timing creation support device, wherein the switching timing creation support device includes: an acquisition part configured to acquire, for each of a plurality of properties of particles contained in a gas in the substrate processing apparatus during a processing for a substrate, a measured value of an amount of the particles from a measuring device; a selection part configured to select properties of a predetermined number of the particles in descending order of temporal variations in the amount of the particles; a determination part configured to determine an operation expression and a switching condition for determining a switching timing based on a temporal change in the amount of the particles for each of the selected properties of the particles; and an output part configured to output the operation expression and the switching condition to the substrate processing apparatus.

20 Claims, 14 Drawing Sheets

(56) References Cited

U.S. PATENT DOCUMENTS

| | | | |
|---|---|---|---|
| 2009/0211706 A1* | 8/2009 | Uchida | H01J 37/32963 |
| | | | 156/345.25 |
| 2009/0253222 A1* | 10/2009 | Morisawa | H01L 22/26 |
| | | | 257/E21.53 |
| 2012/0310403 A1* | 12/2012 | Morisawa | H01J 37/32935 |
| | | | 700/121 |
| 2014/0106477 A1* | 4/2014 | Chen | H01L 21/3065 |
| | | | 702/191 |

* cited by examiner

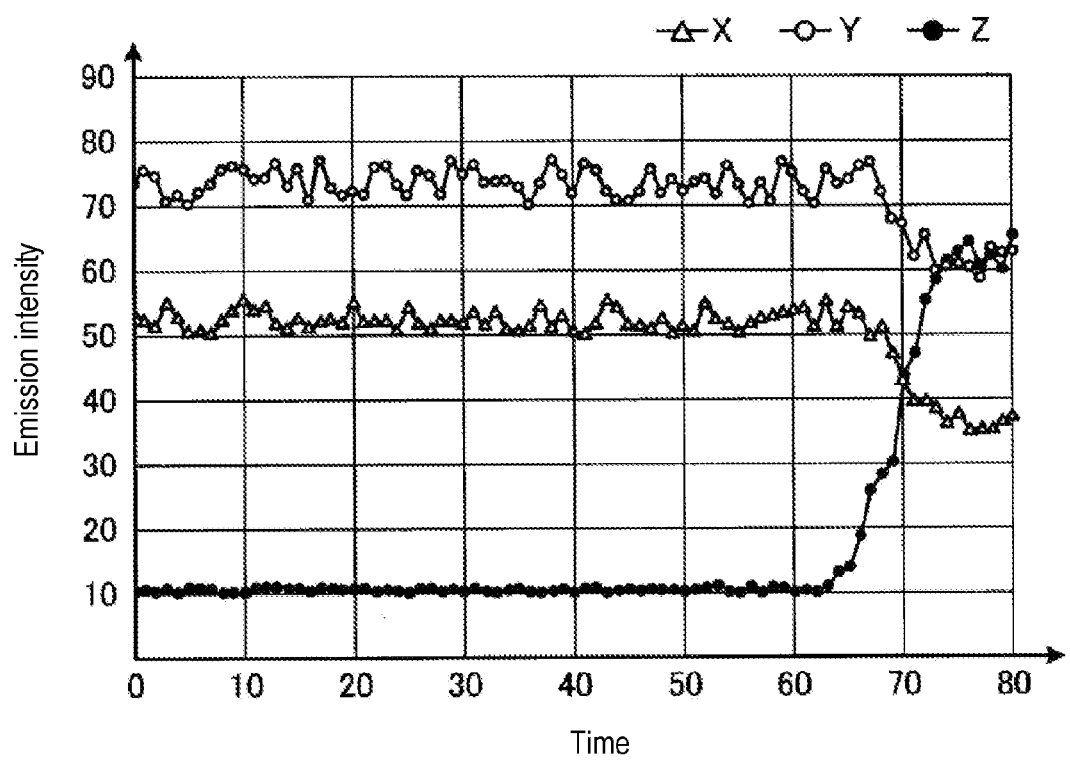

FIG. 10

| Wavelength | Section 0~60 | | Section 75~80 | | Variation (dB) |
|---|---|---|---|---|---|
| | Average value | Range | Average value | Range | |
| X | 52.5 | 4.7 | 36.4 | 3.0 | -3.2 |
| Y | 73.5 | 6.9 | 61.4 | 3.6 | -1.6 |
| Z | 10.4 | 1.0 | 63.4 | 3.4 | 15.7 |

FIG. 11

| Value of operation expression | Section 0~60 | | Section 75~80 | | Variation (dB) |
|---|---|---|---|---|---|
| | Average value | Range | Average value | Range | |
| E | 2.4 | 4.7 | 1791.0 | 297.3 | 57.5 |

SUBSTRATE PROCESSING SYSTEM, SWITCHING TIMING CREATION SUPPORT DEVICE, SWITCHING TIMING CREATION SUPPORT METHOD, AND SUBSTRATE PROCESSING APPARATUS

CROSS-REFERENCE TO RELATED APPLICATION

This application is based upon and claims the benefit of priority from Japanese Patent Application No. 2020-033699, filed on Feb. 28, 2020, the entire contents of which are incorporated herein by reference.

TECHNICAL FIELD

The present disclosure relates to a substrate processing system, a switching timing creation support device, a switching timing creation support method, and a substrate processing apparatus.

BACKGROUND

In manufacturing a semiconductor device, various processes such as a film forming process, an etching process, and the like are performed on a substrate. Further, in an etching process of a substrate having multi-layered films, process conditions such as an etching gas or a pressure may differ from one another among the films forming the respective layers. Therefore, when the etching process of a certain layer is completed, it is necessary to switch the process conditions in order to etch a film of a layer below the certain layer. However, it is difficult to check a state of a substrate while the substrate is being processed. Therefore, the switching of the process conditions is performed by estimating a degree of progress of an etching process based on a change of a gas component in a chamber accommodating the substrate.

PRIOR ART DOCUMENTS

Patent Documents

Patent Document 1: Japanese laid-open publication No. H7-50289

SUMMARY

According to an aspect of the present disclosure, there is provided a substrate processing system including: a substrate processing apparatus configured to execute a processing for a substrate based on a recipe in which process conditions for each of a plurality of processings for the substrate are specified; and a switching timing creation support device configured to support creation of a switching timing of the processing for the substrate. The switching timing creation support device includes an acquisition part, a selection part, a determination part, and an output part. The acquisition part is configured to cause the substrate processing apparatus to execute the processing for the substrate based on the recipe, and to acquire, for each of a plurality of properties of particles including atoms and molecules contained in a gas in the substrate processing apparatus during the execution of the processing, a measured value of an amount of the particles from a measuring device that measures the amount of the particles contained in the gas. The selection part is configured to select, among the properties of the particles, properties of a predetermined number of the particles in descending order of temporal variations in the amount of the particles. The determination part is configured to determine an operation expression and a switching condition for determining the switching timing based on a temporal change in the amount of the particles for each of the selected properties of the predetermined number of the particles. The output part is configured to output the operation expression and the switching condition to the substrate processing apparatus. The substrate processing apparatus includes an execution part, a calculation part, and the instruction part. The execution part is configured to execute the processing for the substrate based on the recipe. The calculation part is configured to calculate a value of the operation expression based on the amount of the particles measured by the measuring device for each of the properties of the particles included in the operation expression. The instruction part configured to instruct the execution part to switch the process conditions when the value of the operation expression satisfies the switching condition.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is an example of temporal changes in emission intensity of wavelengths X, Y, and Z.

FIG. 10 is a diagram illustrating an example of variations in emission intensity of respective wavelengths.

FIG. 11 is a diagram illustrating an example of a variation in value of an operation expression.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of a substrate processing system, a switching timing creation support device, a switching timing creation support method, and a substrate processing apparatus will now be described in detail with reference to the drawings. Further, the disclosed substrate processing system, switching timing creation support device, switching timing creation support method, and substrate processing apparatus are not limited to the following embodiments.

Even if films to be processed are identical, variation of a gas component in a chamber may differ from one another among substrates having different sizes or numbers of holes formed by an etching process. Therefore, when the sizes or numbers of holes are different, it is necessary to individually determine a state of the gas component in the chamber at a switching timing of process conditions for each substrate.

The switching timing of the process conditions requires preliminary experiments for each combination of the process conditions, states of films to be processed, states of the chamber and the like. Thus, a huge amount of time and effort is necessary in order to cope with large item small scale production. In addition, human judgment such as determining physical quantities such as wavelengths and thresholds, which are used to determine the switching timing, is required after the preliminary experiments, and advanced technical knowledge is also required. Further, mistakes may occur in work involving humans. Moreover, since individual differences or thinking affect the work involving humans, it is difficult to maintain the switching timing with a certain level of accuracy or higher.

Therefore, the present disclosure provides a technique capable of improving accuracy of the switching timing of a process.

First Embodiment

[Configuration of Substrate Processing System 1]

Figure 1:
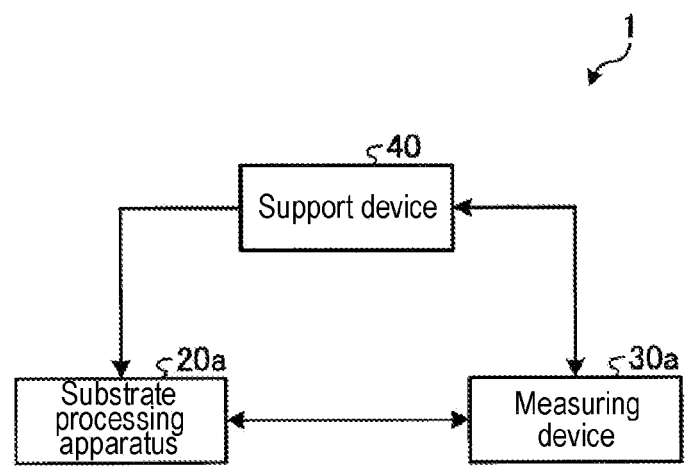
FIG. 1 is a system configuration diagram illustrating an example of a substrate processing system according to an embodiment of the present disclosure.

FIG. 1 is a system configuration diagram illustrating an example of a substrate processing system 1 according to an embodiment of the present disclosure. The substrate processing system 1 includes a substrate processing apparatus 20a, a measuring device 30a, and a support device 40. The support device 40 is an example of a switching timing creation support device.

The substrate processing apparatus 20a performs predetermined processes such as a film forming process, an etching process, a modifying process, and the like on a substrate W. In the present embodiment, the substrate processing apparatus 20a is a plasma etching apparatus that performs an etching process by using plasma on the substrate W having a film to be processed. The substrate processing apparatus 20a accommodates the substrate W in a chamber, and etches the film to be processed by ions or active species contained in plasma by plasmarizing a gas supplied into the chamber.

Furthermore, the substrate processing apparatus 20a performs a plurality of processes on the substrate W while switching process conditions. A timing for switching the process conditions is determined based on a state of the gas in the chamber measured by the measuring device 30a. The state of the gas in the chamber is defined as, for example, an amount of particles for each property of the particles including atoms and molecules existing in the chamber.

The measuring device 30a measures the state of the gas in the substrate processing apparatus 20a and outputs the measured value to the substrate processing apparatus 20a and the support device 40. In the present embodiment, the measuring device 30a is, for example, an optical emission spectrometer (OES).

The support device 40 causes the substrate processing apparatus 20a to experimentally perform an etching process on the substrate W, and causes the measuring device 30a to measure an emission intensity of the gas in the chamber for each wavelength. In addition, the support device 40 specifies one or more wavelengths having large variations in the emission intensity in the chamber, and determines an operation expression for calculating a value with a large variation at a switching timing of the process by using the specified wavelengths. Then, the support device 40 determines the value of the operation expression at the switching timing of the process as a switching condition, and outputs the determined operation expression and the switching condition to the substrate processing apparatus 20a.

When the substrate W is etched, the substrate processing apparatus 20a acquires the emission intensity of the wavelength included in the operation expression, which is determined by the support device 40, from the measuring device 30a. Then, the substrate processing apparatus 20a calculates the value of the operation expression based on the acquired emission intensity, and compares the value of the operation expression with the switching condition determined by the support device 40. When the value of the operation expression satisfies the switching condition, the substrate processing apparatus 20a switches the process conditions of the etching process. Furthermore, the switching of the process conditions also includes switching from conditions during the process to conditions for terminating the process, i.e., switching to a process ending.

[Configuration of Substrate Processing Apparatus 20a]

Figure 2:
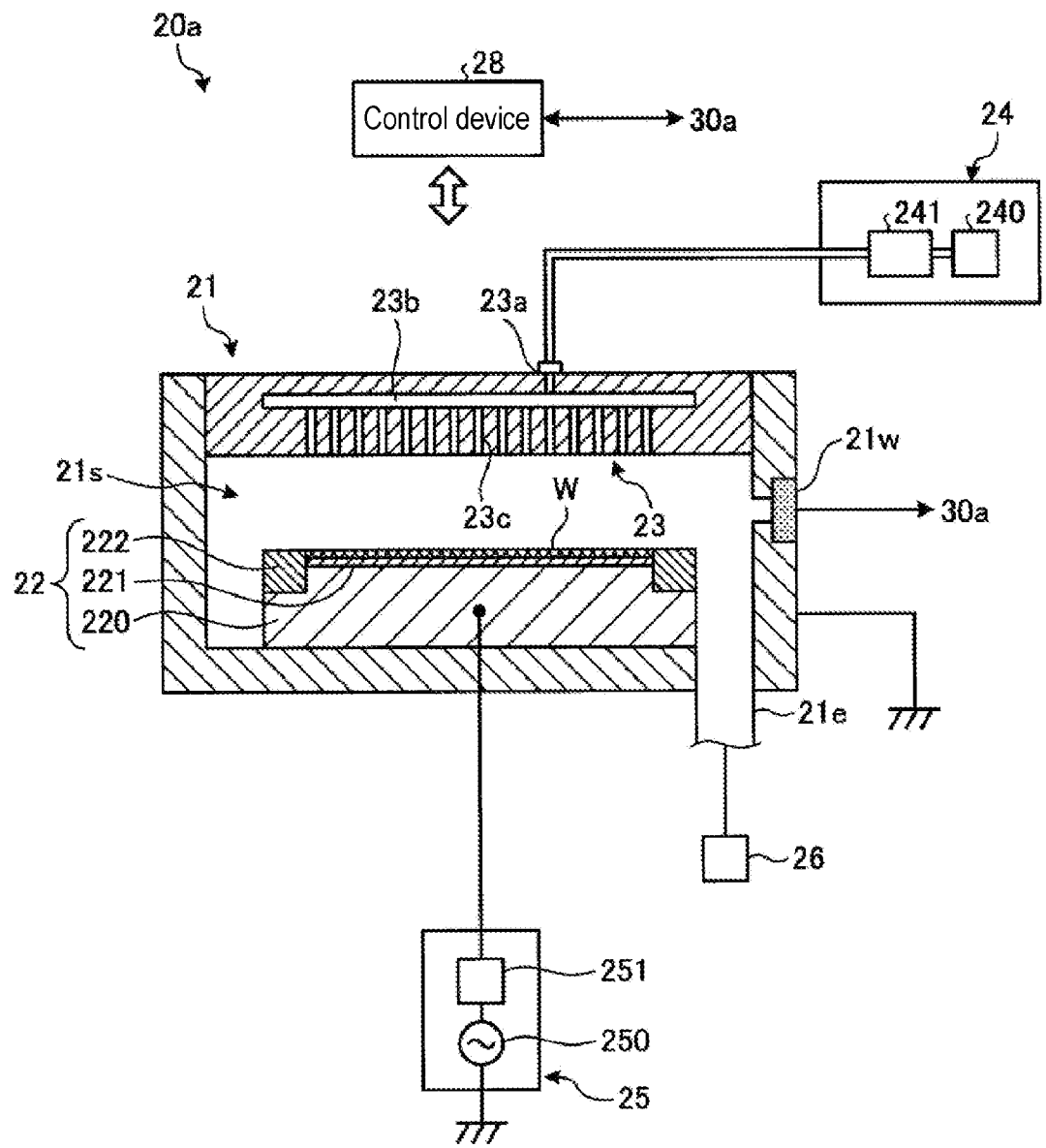
FIG. 2 is a schematic cross-sectional view illustrating an example of a substrate processing apparatus according to a first embodiment of the present disclosure.

FIG. 2 is a schematic cross-sectional view illustrating an example of the substrate processing apparatus 20a according to a first embodiment. The substrate processing apparatus 20a includes a chamber 21, a gas supply 24, a radio frequency (RF) power supply 25, an exhaust system 26, and a control device 28.

In the present embodiment, the chamber 21 includes a support 22 and an upper electrode shower head assembly 23. The support 22 is disposed in a lower region of an internal space 21s of the chamber 21. The upper electrode shower head assembly 23 is disposed above the support 22, and functions as a part of a ceiling plate of the chamber 21.

The chamber 21 has an inner wall surface formed of a conductive member such as anodized aluminum or the like, and is grounded.

The support 22 is configured to support the substrate W in the chamber 21. In the present embodiment, the support 22 includes a lower electrode 220, an electrostatic chuck 221, and an edge ring 222. The electrostatic chuck 221 is disposed on the lower electrode 220, and is configured to support the substrate W on an upper surface of the electrostatic chuck 221. The edge ring 222 is disposed on an upper surface a peripheral portion of the lower electrode 220 so as to surround the substrate W.

A heater (not shown) may be installed in the support 22. In addition, a temperature control flow path (not shown) is formed in the support 22, so as to allow a fluid having a temperature controlled by a chiller unit (not shown) to circulate in the flow path. A temperature of the substrate W disposed on the electrostatic chuck 221 is controlled by the heater in the support 22 and the fluid circulating in the temperature control flow path of the support 22.

The upper electrode shower head assembly 23 is configured to supply one or more types of gases from the gas supply 24 to the internal space 21s. In the present embodiment, the upper electrode shower head assembly 23 includes a gas inlet 23a, a gas diffusion chamber 23b, and a plurality of gas outlets 23c. The gas supply 24 and the gas diffusion chamber 23b are in fluid communication with each other via the gas inlet 23a. The gas diffusion chamber 23b and the internal space 21s are in fluid communication with each other via the plurality of gas outlets 23c. In the present embodiment, the upper electrode shower head assembly 23 is configured to supply one or more types of gases from the gas inlet 23a to the internal space 21s via the gas diffusion chamber 23b and the plurality of gas outlets 23c.

The gas supply 24 includes a gas source 240 and a flow rate controller 241. The gas source 240 is a supply source of a processing gas such as an etching gas or the like. The flow rate controller 241 may include, for example, a mass flow controller or a pressure-controlled flow rate controller. In addition, the flow rate controller 241 may include one or more flow rate modulation devices that modulate or pulse flow rates of the one or more processing gases. The flow rate controller 241 controls the flow rate of the processing gas supplied from the gas source 240 to supply the flow rate-controlled processing gas to the gas inlet 23a.

The RF power supply 25 is configured to supply an RF power, for example, one or more RF signals, to one or more electrodes, such as the lower electrode 220, the upper electrode shower head assembly 23, or both the lower electrode 220 and the upper electrode shower head assembly 23. In the present embodiment, the RF power supply 25 includes an RF generator 250 and a matching circuit 251. The RF power supply 25 in the present embodiment is configured to supply a first RF signal from the RF generator 250 to the lower electrode 220 via the matching circuit 251. An RF spectrum of the first RF signal includes a part of an electromagnetic spectrum having a frequency within a range of 3 Hz to 3,000 GHz. For electronic material processes such as semiconductor processes, the frequency of the RF spectrum used for plasma generation may fall within a range of 100 kHz to 3 GHz in some embodiments, and more specifically, within a range of 200 kHz to 150 MHz. For example, the frequency of the first RF signal may fall within a range of 27 MHz to 100 MHz.

Furthermore, a second RF signal used for drawing ions contained in the plasma may be supplied to the lower electrode 220. For example, the frequency of the second RF signal may fall within a range of 400 kHz to 13.56 MHz. Instead of the second RF signal, direct current (DC) pulses may be supplied to the lower electrode 220.

Also, although not shown, other embodiments may be considered herein. For example, in the RF power supply 25 of an alternative embodiment, an RF generator may supply the first RF signal to the lower electrode 220, another RF generator may supply the second RF signal to the lower electrode 220, and another RF generator may supply a third RF signal to the upper electrode shower head assembly 23. In addition, in another alternative embodiment, a DC voltage may be applied to the upper electrode shower head assembly 23. Furthermore, in various embodiments, amplitudes of one or more RF signals (i.e., the first RF signal, the second RF signal, and the like) may be pulsed or modulated. The amplitude modulation may include pulsing the amplitude of the RF signals between an ON state and an OFF state, or between a plurality of different ON states. Also, phase matching of the RF signals may be controlled, and the phase matching of the amplitude modulation of a plurality of RF signals may be synchronized or asynchronous.

The exhaust system 26 may be connected to, for example, an exhaust port 21e provided at the bottom of the chamber 21. The exhaust system 26 may include a pressure valve, and a vacuum pump such as a turbo molecular pump, a roughing vacuum pump, or a combination thereof.

An opening is formed at a sidewall of the chamber 21, and a window 21w formed of quartz or the like is provided at the opening. Light emitted by particles such as atoms or molecules in the plasma generated in the internal space 21s is received by the measuring device 30a via the window 21w.

Figure 3:
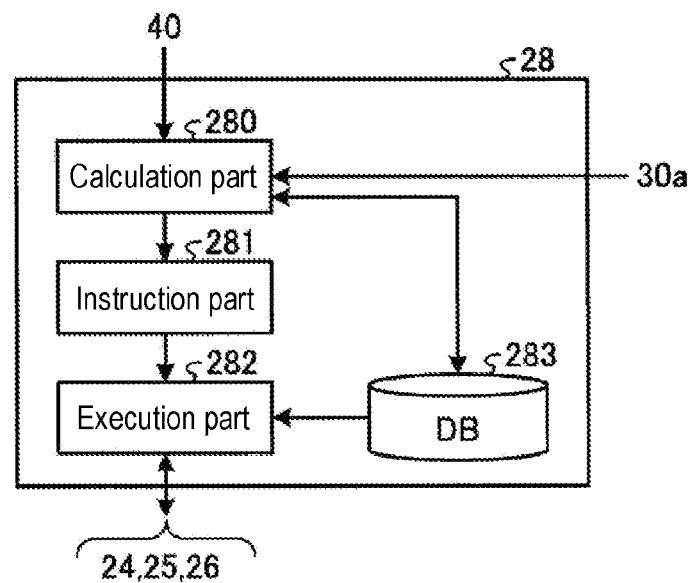
FIG. 3 is a block diagram illustrating an example of a functional configuration of a control device.

In the present embodiment, the control device 28 functions, for example, as illustrated in FIG. 3. FIG. 3 is a block diagram illustrating an example of a functional configuration of the control device 28. The control device 28 has a calculation part 280, an instruction part 281, an execution part 282, and a database (DB) 283.

In the DB 283, a recipe in which process conditions for each of a plurality of processes are specified is stored in advance. In addition, the operation expression and the switching condition, which are determined by the support device 40, are stored in the DB 283 for each of the plurality of processes specified in the recipe. The execution part 282 performs the etching process by controlling the respective components of the substrate processing apparatus 20a such as the gas supply 24, the RF power supply 25, the exhaust system 26 and the like, based on the process conditions of each process specified in the recipe stored in the DB 283. Furthermore, the execution part 282 sequentially performs processes having different process conditions by switching the process conditions of the ongoing process to process conditions of a subsequent process at a timing instructed from the instruction part 281.

When the etching process using plasma is performed by the substrate processing apparatus 20a, a gate valve (not shown) is opened and the substrate W is mounted on the electrostatic chuck 221 by a transfer robot (not shown). Then, the execution part 282 controls the exhaust system 26 so as to exhaust the gas in the chamber 21. Furthermore, the execution part 282 controls the gas supply 24 so that an etching gas from the gas source 240 is supplied into the chamber 21 at a flow rate specified in the process conditions. Thus, the internal pressure of the chamber 21 is adjusted to a pressure specified in the process conditions.

In addition, the execution part 282 controls the RF power supply 25 so that the first RF power having a frequency and a magnitude specified in the process conditions is supplied to the lower electrode 220. Thus, an RF electric field is formed between the upper electrode shower head assembly 23 and the lower electrode 220, and the etching gas supplied into the chamber 21 is plasmarized. Then, the substrate W is etched by ions, radicals or the like contained in the plasma generated in the chamber 21.

The calculation part 280 receives the operation expression and the switching condition for each process from the support device 40, and stores the received operation expression and switching condition in the DB 283 for each process. In addition, when a process of the substrate W is started by the execution part 282, the calculation part 280 reads the operation expression and the switching condition corresponding to the started process from the DB 283. Further, the calculation part 280 acquires a measured value of the emission intensity of the wavelength included in the read operation expression from the measuring device 30a. Furthermore, the calculation part 280 calculates a value of the operation expression based on the measured value of the emission intensity for each wavelength, and outputs the calculated value of the operation expression and the switching condition corresponding to the operation expression to the instruction part 281.

The instruction part 281 determines whether or not the value of the operation expression calculated by the calculation part 280 satisfies the switching condition. When the value of the operation expression satisfies the switching condition, the instruction part 281 instructs the execution part 282 to switch the process.

[Configuration of the Measuring Device 30a]

Figure 4:
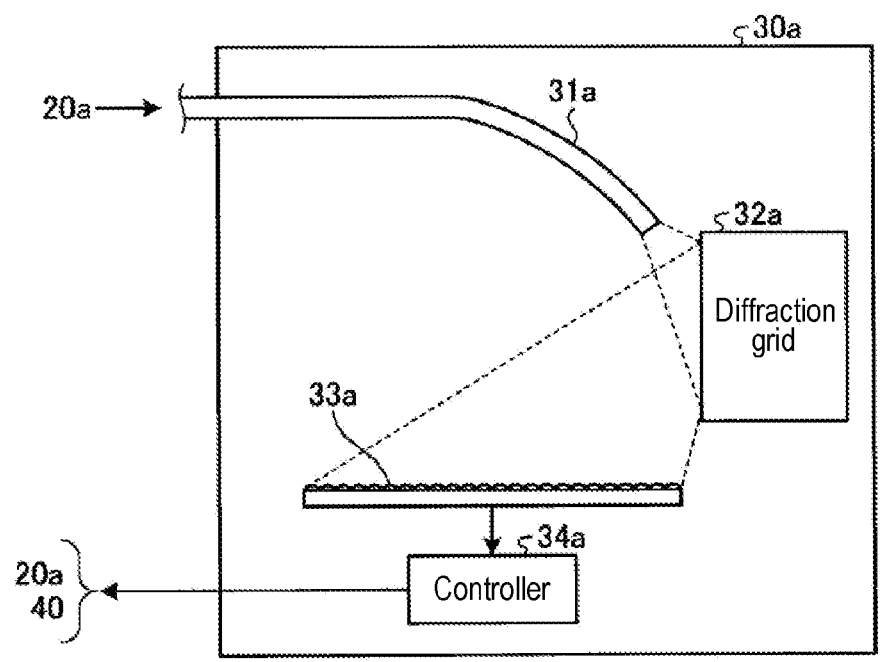
FIG. 4 is a block diagram illustrating an example of a measuring device according to the first embodiment.

FIG. 4 is a block diagram illustrating an example of the measuring device 30a according to the first embodiment. The measuring device 30a includes a light guide 31a, a diffraction grid 32a, a light receiver 33a, and a controller 34a. The measuring device 30a measures a temporal change in the amount of particles for each property of particles including atoms and molecules contained in the gas in the chamber 21 during the processing for the substrate W by the substrate processing apparatus 20a. In the present embodiment, the property of particles is a wavelength of light observed in emission of the particles.

The light guide 31a is, for example, an optical fiber, and receives light emitted by particles contained in the plasma generated in the chamber 21 of the substrate processing apparatus 20a via the window 21w, and guides the received light to the diffraction grid 32a.

The diffraction grid 32a separates the light received via the light guide 31a for each wavelength, and irradiates the separated light to the light receiver 33a.

The light receiver 33a measures an intensity of light for each wavelength, and outputs the measured value to the controller 34a.

The controller 34a outputs the measured value of the emission intensity for each wavelength to the substrate processing apparatus 20a and the support device 40.

[Configuration of Support Device 40]

Figure 5:
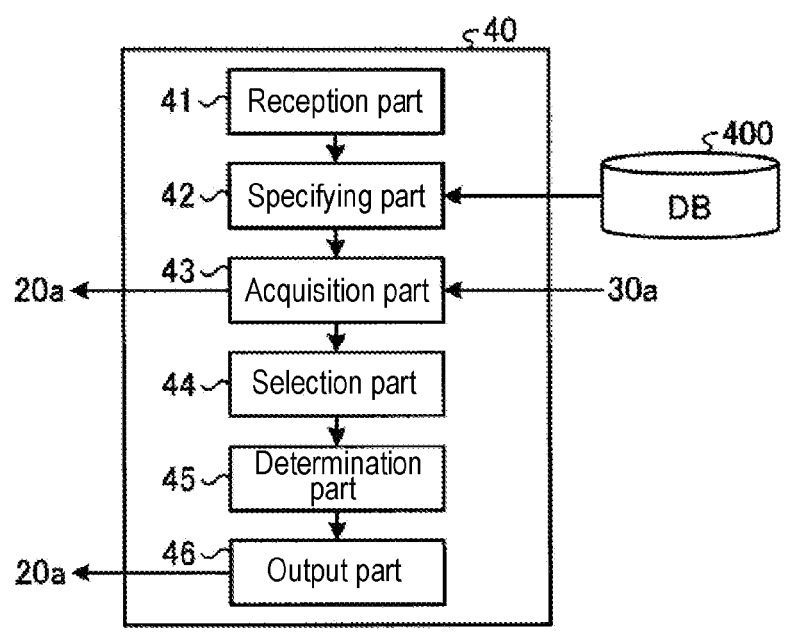
FIG. 5 is a block diagram illustrating an example of a functional configuration of a support device.

FIG. 5 is a block diagram illustrating an example of a functional configuration of the support device 40. The support device 40 includes a reception part 41, a specifying part 42, an acquisition part 43, a selection part 44, a determination part 45, and an output part 46.

The reception part 41 receives, from a user of the substrate processing system 1, a type of a film to be processed, a type of a gas used for processing the substrate W, and a monitoring number indicating the number of properties of particles to be monitored. In the present embodiment, the monitoring number is the number of wavelengths to be monitored. Then, the reception part 41 outputs information on the received film type, gas type, and monitoring number to the specifying part 42.

The specifying part 42 specifies, by referring to a database (DB) 400, properties of the particles contained in the gas in the substrate processing apparatus 20a when the processing for the film of the type received by the reception part 41 is performed, and properties of the particles contained in the gas corresponding to the gas type received by the reception part 41. Then, the specifying part 42 outputs the specified properties of the particles to the acquisition part 43.

In the present embodiment, the specifying part 42 refers to the DB 400 to specify the wavelengths of light observed in the emission of particles generated when the processing for the film of the type received by the reception part 41 is performed. Furthermore, in the present embodiment, the specifying part 42 refers to the DB 400 to specify the wavelengths of light observed in the emission of particles contained in the gas corresponding to the gas type received by the reception part 41. Then, the specifying part 42 outputs information on the specified wavelengths to the acquisition part 43.

In the present embodiment, for each film type, information on the wavelengths of light observed in the emission of particles generated when the processing for the film is performed is stored in the DB 400 in advance. Furthermore, for each gas type, information on the wavelengths of light observed in the emission of particles generated when the processing using the gas is performed is stored in the DB 400 in advance.

The acquisition part 43 causes the substrate processing apparatus 20a to experimentally execute the processing for the substrate W based on the recipe. Further, the acquisition part 43 acquires the measured value of the amount of particles for each property of the particles contained in the gas in the chamber 21 during the execution of the processing from the measuring device 30a. Furthermore, the acquisition part 43 outputs the amount of the particles for each property of the particles to the selection part 44.

In the present embodiment, the acquisition part 43 acquires, for each wavelength of the light observed in the emission of the particles specified by the specifying part 42, the measured value of the emission intensity observed in the emission of the particles from the measuring device 30a as the measured value of the amount of particles contained in the gas in the chamber 21.

The selection part 44 accumulates the measured value of the amount of particles output from the acquisition part 43 for each property of the particles specified by the specifying part 42, in a time series manner until the process is completed. Further, the selection part 44 selects, among the properties of the particles, properties of the particles corresponding to the monitoring number received by the reception part 41, in descending order of temporal variations in the amount of the particles. Furthermore, the selection part 44 outputs the time-series measured value of the amount of the particles for each selected property of the particles to the determination part 45.

In the present embodiment, the selection part 44 accumulates the measured value of the emission intensity output from the acquisition part 43 for each wavelength specified by the specifying part 42, in a time series manner until the processing is completed. Further, the selection part 44 selects, among the wavelengths of which emission intensities have been measured, the wavelengths corresponding to the monitoring number received by the reception part 41, in descending order of temporal variations in the emission intensity. Furthermore, the selection part 44 outputs the time-series measured value of the emission intensity for each selected wavelength to the determination part 45.

The determination part 45 determines the operation expression and the switching condition for determining the switching timing based on the temporal change in the amount of particles for each selected property of the particles. In the present embodiment, the determination part 45 determines the operation expression and the switching condition for determining the switching timing based on the temporal change in the emission intensity for each selected wavelength. The operation expression includes information on the wavelength selected by the selection part 44.

In the present embodiment, the determination part 45 determines the operation expression based on a value of the emission intensity immediately after the start of the etching process and a value of the emission intensity immediately before the end of the etching process in the emission intensity for each selected wavelength. Furthermore, the determination part 45 determines the switching condition based on the value of the emission intensity immediately before the end of the etching process. Specific examples of the operation expression and the switching condition will be described later.

The output part 46 outputs the operation expression and the switching condition determined by the determination part 45 to the substrate processing apparatus 20*a*.

[Processing of Support Device 40]

Figure 6:
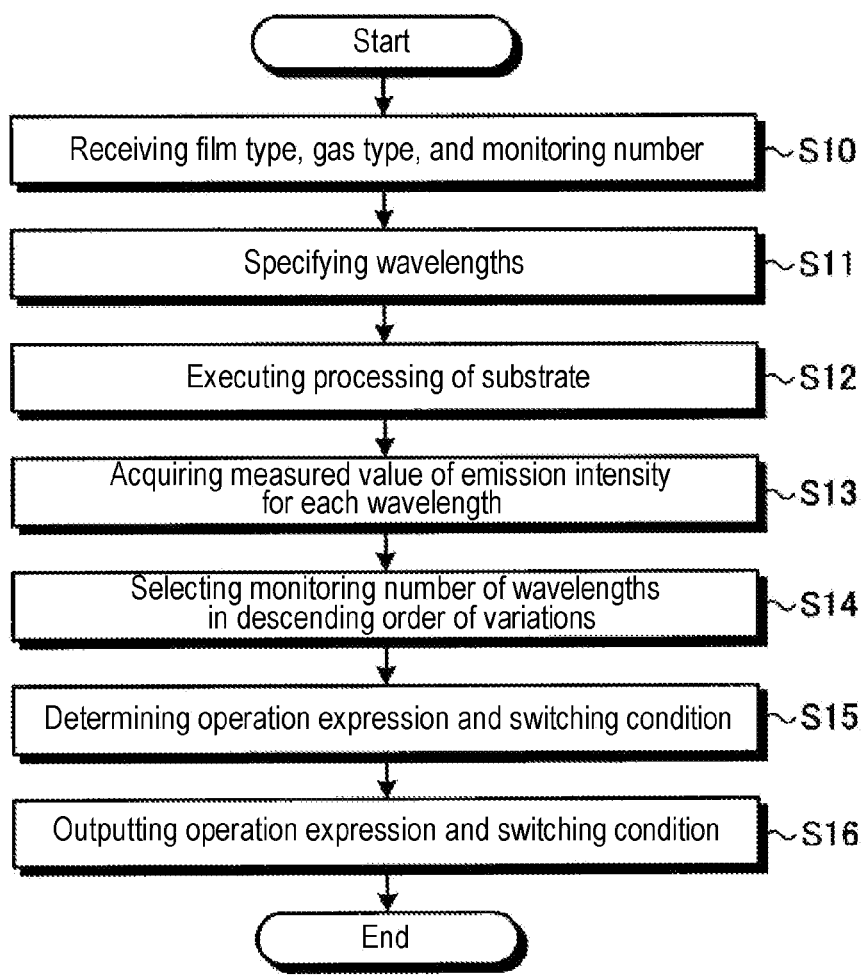
FIG. 6 is a flowchart illustrating an example of a processing of the support device according to the first embodiment.

FIG. 6 is a flowchart illustrating an example of a processing of the support device 40 according to the first embodiment. The processing illustrated in FIG. 6 is performed for each process condition. The processing illustrated in FIG. 6 is an example of a switching timing creation support method.

First, the reception part 41 receives, from the user of the substrate processing system 1, the type of the film to be processed, the type of the gas used for the processing, and the monitoring number (S10). Then, the reception part 41 outputs the received information to the specifying part 42.

Subsequently, the specifying part 42 specifies wavelengths of light observed in the emission of particles generated during the processing for the film of the type received by the reception part 41, by referring to the DB 400 (S11). In addition, the specifying part 42 specifies wavelengths of light observed in the emission of particles contained in the gas corresponding to the gas type received by the reception part 41, by referring to the DB 400 (S11). Then, the specifying part 42 outputs information on the specified wavelengths to the acquisition part 43.

Subsequently, the acquisition part 43 causes the substrate processing apparatus 20*a* to experimentally perform the processing for the substrate W based on a recipe (S12). In the processing for the substrate W experimentally performed, a substrate having the same configuration as the substrate W used in actual processing is used.

Subsequently, the acquisition part 43 acquires, for each wavelength of light observed in the emission of the particles specified by the specifying part 42, a measured value of the emission intensity observed in the emission of particles as the measured value of the amount of the particles contained in the gas in the chamber 21, from the measuring device 30*a* (S13). Subsequently, the acquisition part 43 outputs information on the emission intensity for each wavelength to the selection part 44. Step S13 is an example of an acquisition step.

Subsequently, the selection part 44 accumulates the measured value of the emission intensity output from the acquisition part 43 for each wavelength specified by the specifying part 42 in a time series manner until the processing is completed. Further, the selection part 44 selects, among the wavelengths of which emission intensities have been measured, wavelengths corresponding to the monitoring number received by the reception part 41, in descending order of temporal variations in the emission intensity (S14). Furthermore, the selection part 44 outputs the time-series measured value of the emission intensity for each selected wavelength to the determination part 45. Step S14 is an example of a selection step.

Subsequently, the determination part 45 determines an operation expression and a switching condition for determining a switching timing based on a temporal change in the emission intensity for each selected wavelength (S15). Step S15 is an example of a determination step.

Subsequently, the output part 46 outputs the determined operation expression and switching condition to the substrate processing apparatus 20*a* (S16). Step S16 is an example of an output step. Then, the support device 40 terminates the processing illustrated in the flowchart of FIG. 6.

Figure 7A:
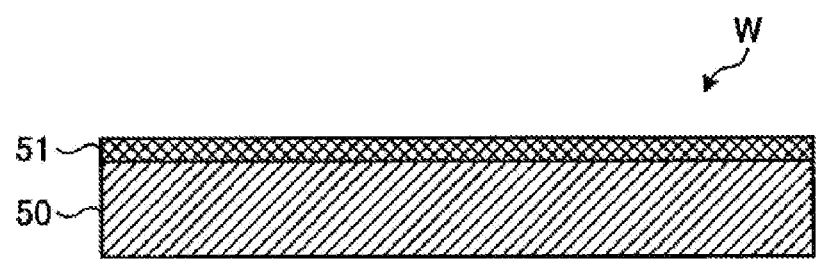
FIG. 7A is a cross-sectional view illustrating an example of a substrate W before an etching process.
Figure 7B:
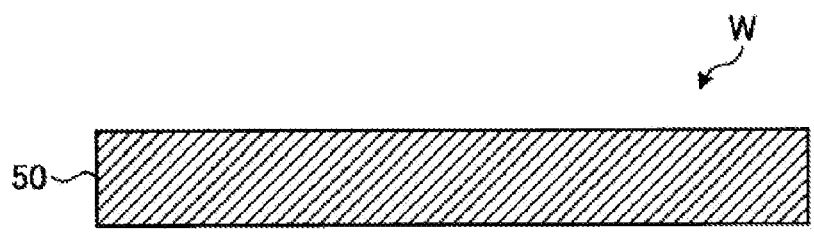
FIG. 7B is a cross-sectional view illustrating an example of the substrate W after the etching process.

In the processing illustrated in FIG. 6, for example, as illustrated in FIG. 7A, an etching process is experimentally performed on a substrate W on which an etching target film 51 is deposited on a base 50. When the etching process is completed, for example, as illustrated in FIG. 7B, the etching target film 51 is removed from the substrate W.

Figure 8A:
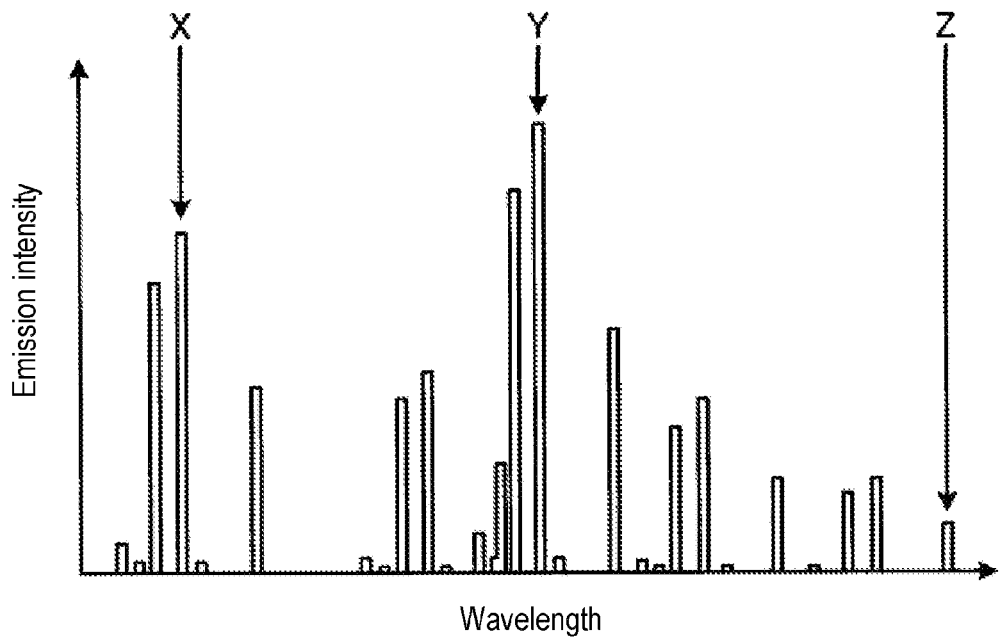
FIG. 8A is a diagram illustrating an example of emission intensity for each wavelength immediately after a start of the etching process.
Figure 8B:
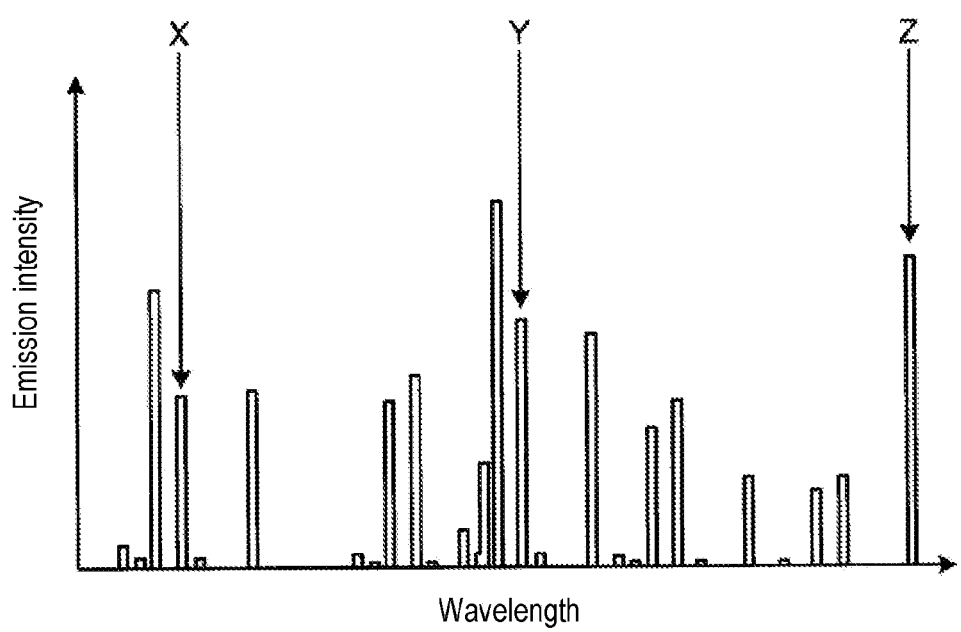
FIG. 8B is a diagram illustrating an example of emission intensity for each wavelength immediately before an end of the etching process.

Immediately after the start of the etching process, an emission intensity is measured for each wavelength by the measuring device 30*a*, as illustrated in FIG. 8A, for example. FIG. 8A is a diagram illustrating an example of the emission intensity for each wavelength immediately after the start of the etching process. In addition, immediately before the completion of the etching process, the emission intensity is measured for each wavelength as illustrated in FIG. 8B, for example. FIG. 8B is a diagram illustrating an example of the emission intensity for each wavelength immediately before the end of the etching process. Comparing FIG. 8A with FIG. 8B, variations in the emission intensity of wavelengths X, Y, and Z are larger than variations in the emission intensity of other wavelengths.

For example, when the monitoring number received from the user by the reception part 41 is three, the selection part 44 selects the wavelengths X, Y, and Z as the top three wavelengths having large temporal variations in the emission intensity. An Example of temporal changes in the emission intensity of the wavelengths X, Y, and Z is illustrated in FIG. 9.

FIG. 9 is a diagram illustrating an example of the temporal changes in the emission intensity of the wavelengths X, Y, and Z. In the temporal changes of the emission intensity illustrated in FIG. 9, there are almost no temporal changes in the emission intensity in a section from 0 to 60 immediately after the start of the etching process, whereas the temporal changes in the emission intensity increase in a section from 61 to 74. In addition, in a section from 75 to 80 immediately before the end of the etching process, there are almost no temporal changes in the emission intensity.

Furthermore, in the wavelengths X and Y, the emission intensities in the section from 75 to 80 immediately before the end of the etching process are lower than those in the section from 0 to 60 immediately after the start of the etching process. On the other hand, in the wavelength Z, the emission intensity in the section from 75 to 80 immediately before the end of the etching process is higher than that in the section from 0 to 60 immediately after the start of the etching process. That is, the wavelengths X and Y are wavelengths having decreasing emission intensities with the progress of the etching process, and the wavelength Z is a wavelength having increasing emission intensity with the progress of the etching process.

With respect to the temporal changes in the emission intensity of the wavelengths X, Y, and Z illustrated in FIG. 9, variations, and average values and ranges in the respective sections are calculated, for example, as illustrated in FIG. 10. FIG. 10 is a diagram illustrating an example of variations in the emission intensity of the wavelengths. The variations are calculated according to Equation (1) below.

$$\text{Variation} = 20 \log \{(\text{Average value in the section from 70 to 80})/(\text{Average value in the section from 0 to 60})\} \quad (1)$$

Referring to FIG. 10, the variations in the average values of the section from 75 to 80 with respect to the average values of the section from 0 to 60 are not so large with respect to the ranges of the respective sections. Therefore, if the switching timing of the process conditions is determined using any of the wavelengths X, Y, and Z, erroneous judgement of the switching timing may occur.

Therefore, in the present embodiment, a predetermined operation expression is applied to the emission intensities of the wavelengths X, Y, and Z illustrated in FIG. 9 and a switching timing of the process conditions is determined based on a temporal change in a value of the operation expression. As the value of the operation expression in the present embodiment, for example, a value E in Equation (2) described below may be used.

$$E = (|A(1) - A(1)_{max}| + \ldots + |A(m) - A(m)_{max}|) \times (|B(1) - B(1)_{min}| + \ldots + |B(n) - B(n)_{min}|) \quad (2)$$

In Equation (2) described above, $A(m)$ denotes an emission intensity of an m-th wavelength having a decreasing emission intensity with the progress of the etching process, and $A(m)_{max}$ denotes a maximum value of the emission intensity in the section from 0 to 60. Furthermore, $B(m)$ denotes an emission intensity of an n-th wavelength having an increasing emission intensity with the progress of the etching process, and $B(m)_{min}$ denotes a minimum value of the emission intensity in the section from 0 to 60. Also, m and n are natural numbers satisfying n+m=monitoring number.

In the example of FIG. 9, for example, the following Equation (3) may be determined as the operation expression.

$$E = (|X - X_{max}| + |Y - Y_{max}|) \times (|Z - Z_{min}|) \quad (3)$$

Based on Equation (3) described above, a variation, and an average value and range in each section may be calculated, for example, as illustrated in FIG. 11. FIG. 11 is a diagram illustrating an example of the variation in the value E of the operation expression. Referring to FIG. 11, the variation in the average value of the section from 75 to 80 with respect to the average value of the section from 0 to 60 is larger than the case of FIG. 10. Therefore, by determining the switching timing of the process conditions based on the value of Equation (3) above, it is possible to further suppress erroneous judgment of the switching timing than in the case of determining the switching timing of the process conditions by using any of the wavelengths X, Y, and Z.

The determination part 45 determines, as the switching condition, a condition under which the value E of the determined operation expression becomes a value that falls within a predetermined range centered on the average value in the section from 75 to 80 immediately before the end of the etching process. In addition, when the average value of the value E of the operation expression in the section from 0 to 60 immediately after the start of the etching process is set to be 0% and the average value of the value E of the operation expression in the section from 75 to 80 immediately before the end of the etching process is set to be 100%, a condition under which the value E of the determined operation expression becomes a value that falls within a range of 90% or more and 100% or less may be determined as the switching condition.

Meanwhile, when the substrates W have different sizes or numbers of holes formed by the etching process, even if a film to be processed is identical, the variation of the gas component in the chamber 21 during the processing for the substrates W may differ from one another among the substrates. Therefore, when the substrates W are different, it is necessary to individually determine the state of the gas component in the chamber 21 at the switching timing of the process conditions for the respective substrate W.

In order to determine the switching timing of the process conditions, preliminary experiments are required for each combination of the process conditions, the state of a film to be processed, a difference in product mask pattern, the state of the chamber 21, or the like, which takes a huge amount of time and effort to deal with large item small scale production. In addition, after the preliminary experiments, human judgment such as determination of physical quantities such as wavelengths and thresholds, which are used to determine the switching timing is required, and advanced technical knowledge is also required. Further, mistakes may occur in work involving humans. Moreover, since individual differences or thinking affect the work involving humans, it is difficult to maintain the switching timing at a certain level of accuracy or higher.

On the other hand, in the substrate processing system 1 according to the present embodiment, since the preliminary experiments for each combination of the process conditions, the state of the film to be processed, the difference in product mask pattern, the state of the chamber 21, or the like are executed without human intervention, it is possible to suppress artificial error. In addition, since a worker does not need to have advanced technical knowledge, anyone can create the switching timing with a certain level of accuracy or higher.

[Processing of Substrate Processing Apparatus 20a]

Figure 12:
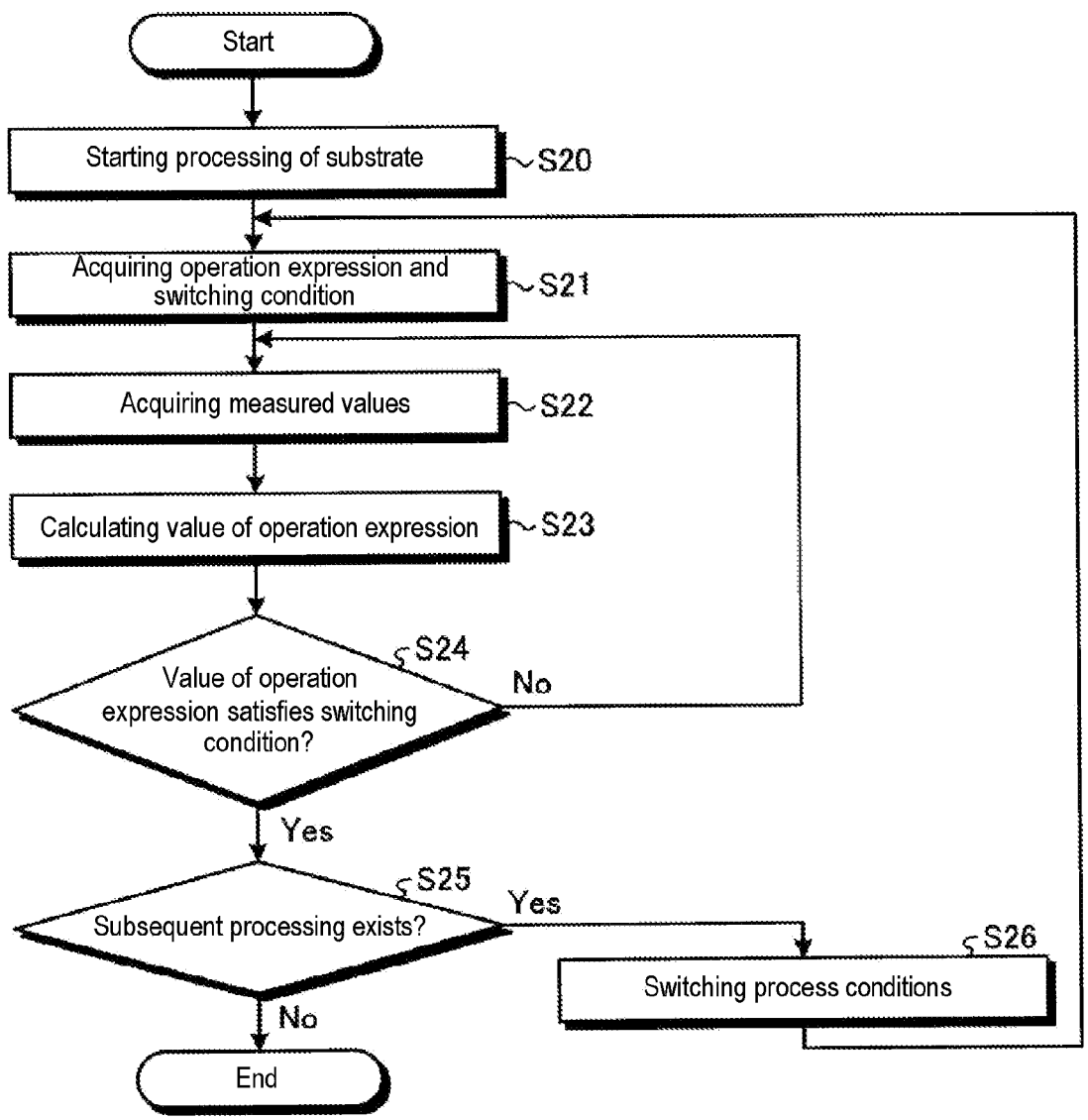
FIG. 12 is a flowchart illustrating an example of a processing of the substrate processing apparatus according to the first embodiment.

FIG. 12 is a flow chart illustrating an example of a processing of the substrate processing apparatus 20a according to the first embodiment. The processing illustrated in FIG. 12 is realized by controlling the respective components of the substrate processing apparatus 20a by the control device 28. Furthermore, before the start of the processing illustrated in FIG. 12, the calculation part 280 of the substrate processing apparatus 20a receives the operation expression and the switching condition for each processing from the support device 40 and stores the same in the DB 283.

First, the execution part 282 acquires a recipe from the DB 283 and specifies process conditions for a processing to be executed. Then, the execution part 282 starts the processing for the substrate W by controlling the respective components of the substrate processing apparatus 20a based on the specified process conditions (S20).

Subsequently, the calculation part 280 acquires the operation expression and the switching condition corresponding to the processing executed by the execution part 282 from the DB 283 (S21). Further, the calculation part 280 acquires measured values of the emission intensities of the wavelengths included in the operation expression from the measuring device 30a (S22). Furthermore, the calculation part 280 calculates a value E of the operation expression based on the measured values of the emission intensities for the respective wavelengths (S23). Furthermore, the calculation part 280 outputs the calculated value E of the operation expression and the switching condition corresponding to the operation expression to the instruction part 281.

Subsequently, the instruction part 281 determines whether or not the value E of the operation expression calculated by the calculation part 280 falls within a range of values indicated in the switching condition, thereby determining whether or not the value E of the operation expression satisfies the switching condition (S24). When the value E of the operation expression does not satisfy the switching condition (S24: "No"), the processing indicated at step S22 is again executed.

On the other hand, when the value E of the operation expression satisfies the switching condition (S24: "Yes"), the execution part 282 refers to the recipe to determine whether or not there is a subsequent processing (S25). When a subsequent processing exists (S25: "Yes"), the execution part 282 switches the process conditions to process conditions of a subsequent processing by referring to the recipe (S26). Further, the execution part 282 starts the processing for the substrate W by controlling the respective components of the substrate processing apparatus 20a based on the switched process conditions. Subsequently, the processing indicated at step S21 is again executed.

On the other hand, when no processing exists (S25: "No"), the processing illustrated in the flowchart of FIG. 12 is terminated. The determination of the end of the processing may be also considered as a switching of the process conditions in the present embodiment. That is, the technique of the present embodiment can be also applied to switching from the state during the processing to the state where the processing is terminated, as an example of switching the process conditions.

[Hardware]

Figure 13:
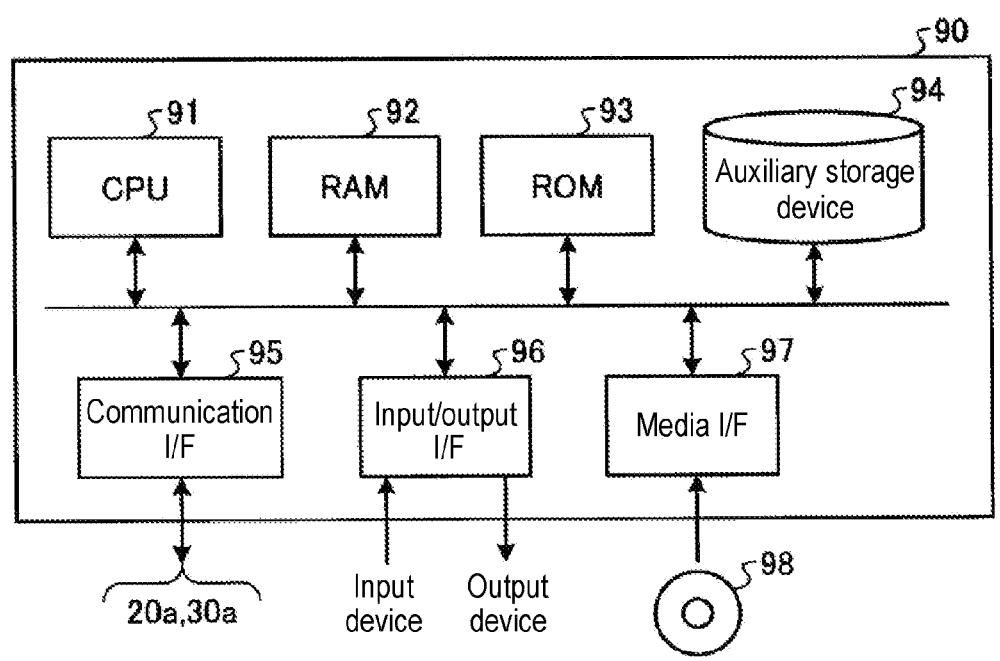
FIG. 13 is a diagram illustrating an example of a computer that realizes a function of the support device.

The support device 40 is implemented by, for example, a computer 90 having a configuration as illustrated in FIG. 13. FIG. 13 is a diagram illustrating an example of the computer 90 for implementing the function of the support device 40. The computer 90 includes a central processing unit (CPU) 91, a random access memory (RAM) 92, a read only memory (ROM) 93, an auxiliary storage device 94, a communication interface (IF) 95, an input and output I/F 96, and a media I/F 97.

The CPU 91 operates based on a program stored in the ROM 93 or the auxiliary storage device 94 to control the respective components. The ROM 93 stores a boot program executed by the CPU 91 when the computer 90 starts up, a program depending on a hardware of the computer 90, and the like.

The auxiliary storage device 94 is, for example, a hard disk drive (HDD) or a solid state drive (SSD), and stores a program executed by the CPU 91 and data used by the program. The CPU 91 reads the program from the auxiliary storage device 94, loads the program on the RAM 92, and executes the loaded program.

The communication I/F 95 performs communications with the substrate processing apparatus 20a and the measuring device 30a via a communication line such as a local area network (LAN) or the like. The communication I/F 95 receives data from the substrate processing apparatus 20a and the measuring device 30a via the communication line, and sends the data to the CPU 91. Further, and the communication I/F 95 sends data generated by the CPU 91 to the substrate processing apparatus 20a and the measuring device 30a via the communication line.

The CPU 91 controls an input device such as a keyboard or the like and an output device such as a display or the like via the input and output I/F 96. The CPU 91 acquires a signal input from the input device via the input and output I/F 96. Furthermore, the CPU 91 outputs data generated by the CPU 91 to the output device via the input and output I/F 96.

The media I/F 97 reads a program or data stored in a recording medium 98, and stores the same in the auxiliary storage device 94. The recording medium 98 may be, for example, an optical recording medium such as a digital versatile disc (DVD) or a phase change rewritable disk (PD), a magneto-optical recording medium such as a magneto-optical disk (MO), a tape medium, a magnetic recording medium, a semiconductor memory, or the like.

The CPU 91 of the computer 90 implements the respective functions of the reception part 41, the specifying part 42, the acquisition part 43, the selection part 44, the determination part 45, and the output part 46, by executing the program loaded on the RAM 92.

The CPU 91 of the computer 90 reads the program, which is to be loaded on the RAM 92, from the recording medium 98 and stores the same in the auxiliary storage device 94. As another example, the CPU 91 may acquire the program from another device via the communication line and store the same in the auxiliary storage device 94.

The first embodiment has been described above. As described above, the substrate processing system 1 according to the present embodiment includes the substrate processing apparatus 20a that performs a processing for the substrate W based on the recipe in which the process conditions of each of a plurality of processings are specified, and the support device 40 that supports the creation of the switching timing of the processing for the substrate W. The support device 40 includes the acquisition part 43, the selection part 44, the determination part 45, and the output part 46. The acquisition part 43 causes the substrate processing apparatus 20a to execute the processing for the substrate W based on the recipe, and acquires measured values of the amount of particles for each property of particles including atoms and molecules contained in the gas in the substrate processing apparatus 20a during the execution of the processing, from the measuring device 30a that measures the amount of particles contained in the gas. The selection part 44 selects, among the properties of particles, a predetermined number of properties of particles in descending order of temporal variations in the amount of particles. The determination part 45 determines the operation expression and the switching condition for determining the switching timing based on the temporal change in the amount of particles for each selected property of the particles. The output part 46 outputs the operation expression and switching conditions to the substrate processing apparatus 20a. The substrate processing apparatus 20a has the calculation part 280, the instruction part 281, and the execution part 282. The execution part 282 executes the processing for the substrate W based on the recipe. The calculation part 280 calculates the value E of the operation expression based on the amount of particles measured by the measuring device 30a for each property of the particles included in the operation expression. The instruction part 281 instructs the execution part 282 to switch the processing when the value E of the operation expression satisfies the switching condition. Thus, it is possible to improve the accuracy of the switching timing of the processing.

Further, in the aforementioned embodiment, the support device 40 has the reception part 41 and the specifying part 42. The reception part 41 receives the type of the film to be processed and the type of the gas used for the processing. The specifying part 42 specifies the properties of the particles contained in the gas in the substrate processing apparatus 20a when the processing for the film of the type received by the reception part 41 is performed, and the properties of the particles contained in the gas corresponding to the gas type received by the reception part 41, by referring to the DB 400 in which the properties of particles generated in the processing using the film and the gas are stored in association with the type of the film and the gas, respectively. The acquisition part 43 acquires, for each property of the particles specified by the specifying part 42, the measured values of the amount of particles contained in the gas in the substrate processing apparatus 20a from the measuring device 30a. Thus, the user's work of specifying the particles to be measured is omitted based on the type of the film to be processed and the type of the gas used for the processing.

Moreover, in the aforementioned embodiment, the properties of the particles are the wavelengths of light observed in the emission of the particles. In addition, the specifying part 42 specifies, by referring to the DB 400, the wavelengths of the light observed in the emission of the particles generated when the processing for the film of the type received by the reception part 41 is performed, and the wavelengths of light observed in the emission of particles contained in the gas corresponding to the gas type received by the reception part 41. Furthermore, the acquisition part 43 acquires, for each wavelength of light observed in the emission of the particles specified by the specifying part 42, the measured values of the emission intensity observed in the emission of the particles as the measured values of the amount of particles contained in the gas in the substrate processing apparatus 20a, from the measuring device 30a. The selection part 44 selects, among the wavelengths of which emission intensities have been measured, the predetermined number of wavelengths in descending order of the temporal variations in the emission intensity. The determination part 45 determines the operation expression and the switching condition for determining the switching timing based on the temporal changes in the emission intensity of the respective selected wavelengths. The calculation part 280 calculates the value E of the operation expression based on the measured emission intensities of the respective wavelengths included in the operation expression. Thus, the switching timing of the processing can be specified based on the emission intensities of the wavelengths of light emitted from plasma.

Furthermore, in the aforementioned embodiment, the reception part 41 further receives the monitoring number that indicates the number of wavelengths of light observed in the light emission of particles to be monitored. The selection part 44 selects, among the wavelengths of which emission intensities have been measured, the wavelengths corresponding to the monitoring number received by the reception part 41, in descending order of the temporal variations in the emission intensity. Thus, it is possible to reduce the processing load of the support device 40.

In addition, the switching timing creation support method according to the aforementioned embodiment includes the acquisition step, the selection step, the determination step, and the output step. At the acquisition step, the processing for the substrate W based on the recipe in which the process conditions of each of a plurality of processings are specified is executed by the substrate processing apparatus 20a, and for each property of the particles including the atoms and molecules contained in the gas in the substrate processing apparatus 20a during the execution of the processing, the measured values of the amount of particles are acquired from the measuring device 30a that measures the amount of particles contained in the gas. At the selection step, among the properties of particles, a predetermined number of properties of particles are selected in descending order of the temporal variations in the amount of particles. At the determination step, the operation expression and the switching condition for determining the switching timing of the processing are determined based on the temporal change in the amount of particles for each selected property of the particles. At the output step, the operation expression and the switching condition are output to the substrate processing apparatus 20a. Thus, it is possible to improve the accuracy of the switching timing of the processing.

Second Embodiment

In the first embodiment described above, the switching timing of the processing is specified based on the emission intensity for each wavelength of light emitted from the plasma generated in the chamber 21. On the other hand, in the present embodiment, the number of particles is measured for each mass of particles contained in the gas in the chamber 21, and the switching timing of the processing is specified based on a temporal change in the measured number of particles. The mass of particles is an example of a property of particles. Thus, the switching timing of a processing can be specified even in a processing without using plasma.

[Configuration of Substrate Processing System 1]

A substrate processing system 1 according to the present embodiment includes a substrate processing apparatus 20b, a measuring device 30b, and a support device 40. The substrate processing system 1 according to the present embodiment has the same configuration as that of the substrate processing system 1 of the first embodiment illustrated in FIG. 1, except that the substrate processing apparatus 20b is provided instead of the substrate processing apparatus 20a and the measuring device 30b is provided instead of the measuring device 30a. Therefore, an illustration of the substrate processing apparatus 1 will be omitted.

[Configuration of Substrate Processing Apparatus 20b]

Figure 14:
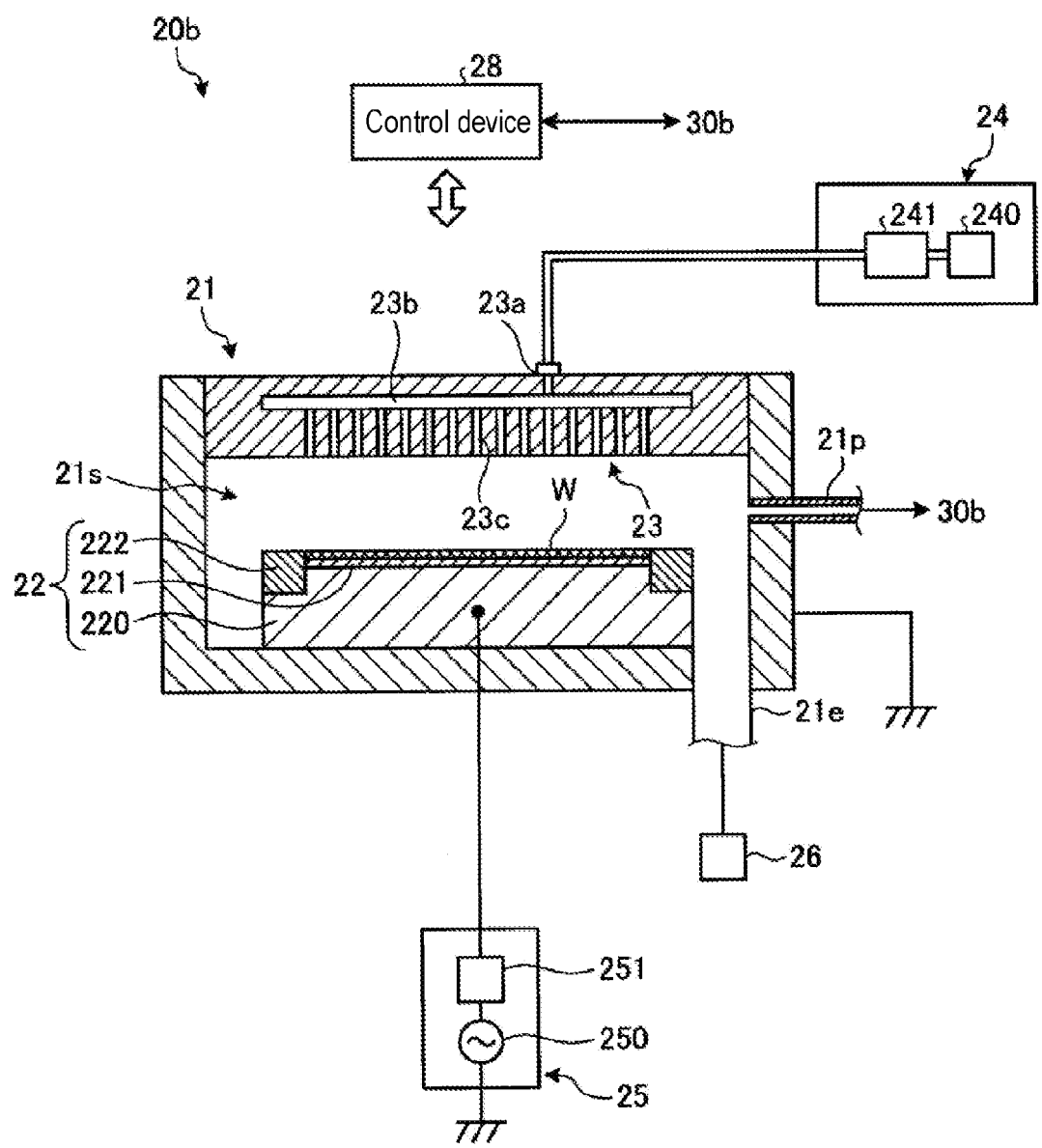
FIG. 14 is a schematic cross-sectional view illustrating an example of a substrate processing apparatus according to a second embodiment of the present disclosure.

FIG. 14 is a schematic cross-sectional view illustrating an example of the substrate processing apparatus 20b according to the second embodiment of the present disclosure. In FIG. 14, components with the same reference numerals as those in FIG. 2 have the same or similar functions as the components in FIG. 2 except for the points described below, and therefore, a description thereof will be omitted.

An opening is formed in the sidewall of the chamber 21, and one end of a pipe 21p is connected to the opening. The other end of the pipe 21p is connected to the measuring device 30b. A part of a gas in the chamber 21 is sent to the measuring device 30b via the pipe 21p.

The configuration of the control device 28 according to the present embodiment is identical to that of the control device 28 illustrated in FIG. 3 except for the points described below, and therefore, an illustration thereof will be omitted. In the present embodiment, the calculation part 280 instructs the measuring device 30b to measure the number of particles for each mass included in the operation expression. Further, the calculation part 280 acquires measured values of the number of particles for each mass from the measuring device 30b. Furthermore, the calculation part 280 calculates a value E of the operation expression based on the measured values of the number of particles for each mass, and outputs the calculated value E of the operation expression and the switching condition corresponding to the operation expression to the instruction part 281.

[Configuration of Measuring Device 30b]

Figure 15:
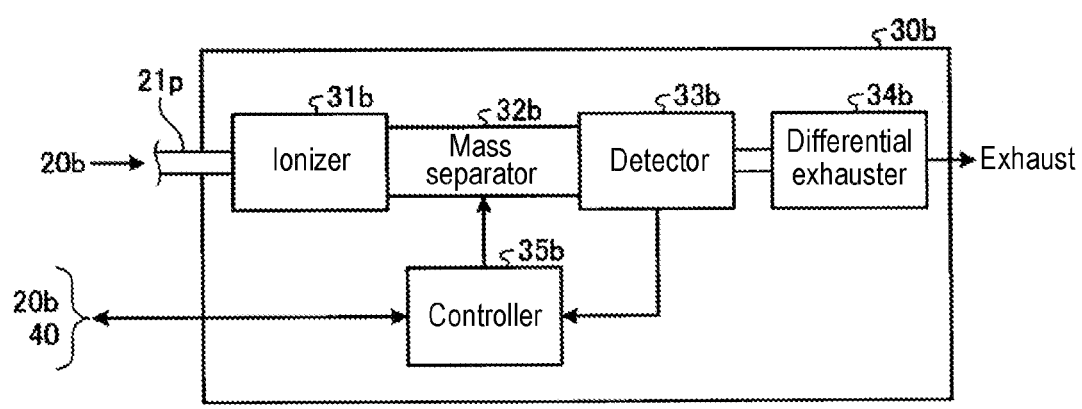
FIG. 15 is a block diagram illustrating an example of a measuring device according to the second embodiment.

FIG. 15 is a block diagram illustrating an example of the measuring device 30b according to the second embodiment. The measuring device 30b has an ionizer 31b, a mass separator 32b, a detector 33b, a differential exhauster 34b, and a controller 35b. The measuring device 30b according to the present embodiment is, for example, a mass spectrometer.

The ionizer 31b ionizes particles contained in the gas introduced via the pipe 21p.

The mass separator 32b forms an electric field or a magnetic field according to a ratio of a mass m and a charge z, which is instructed by the controller 35b. The particles ionized by the ionizer 31b pass through the electric field or the magnetic field formed by the mass separator 32b. Further, only the particles having the ratio of the mass m and the charge z according to the formed electric field or magnetic field reach the detector 33b.

The detector 33b detects the number of particles that have reached the detector 33b via the mass separator 32b.

The differential exhauster 34b sucks the gas introduced via the pipe 21p to guide the gas to the ionizer 31b, the mass separator 32b, and the detector 33b.

The controller 35b receives information on the mass m from the substrate processing apparatus 20b and the support device 40, and sets a ratio of the mass m to the charge z corresponding to the received mass m in the mass separator 32b. Further, the controller 35b outputs the number of particles having the mass m detected by the detector 33b to the substrate processing apparatus 20b and the support device 40.

[Configuration of Support Device 40]

The configuration of the support device 40 according to the present embodiment is identical to that of the support device 40 illustrated in FIG. 5 except for the points described below, and therefore, an illustration thereof will be omitted.

In the present embodiment, the reception part 41 receives, from the user of the substrate processing system 1, a type of a film to be processed, a type of a gas used for the processing the substrate W, and a monitoring number that indicates the number of masses of particles to be monitored. Further, the reception part 41 outputs information on the received type of the film, type of the gas, and monitoring number to the specifying part 42.

In the present embodiment, the specifying part 42 specifies masses of particles contained in the gas in the substrate processing apparatus 20a when the processing for the film of the type received by the reception part 41 is performed, and masses of particles contained in the gas corresponding to the gas type received by the reception part 41, by referring to the DB 400. Further, the specifying part 42 outputs the specified masses of particles to the acquisition part 43.

In the present embodiment, for each type of a film, information on masses of particles generated when a processing for the film is performed is stored in the DB 400 in advance. Furthermore, for each type of a gas, information on mass of particles generated when a processing using the gas is performed is stored in the DB 400 in advance.

In the present embodiment, the acquisition part 43 instructs the measuring device 30b to measure the number of particles for each mass of the particles specified by the specifying part 42. Further, the acquisition part 43 acquires the measured value of the number of particles for each mass of the particles as the measured value of the amount of particles contained in the gas in the chamber 21, from the measuring device 30b. Furthermore, the acquisition part 43 outputs the number of particles for each mass of the particles to the selection part 44.

In the present embodiment, the selection part 44 accumulates the measured value of the number of particles output from the acquisition part 43 for each mass specified by the specifying part 42 in a time series manner until the processing is completed. Further, the selection part 44 selects, among the masses of the particles of which numbers have been measured, masses corresponding to the monitoring number received by the reception part 41 in descending order of temporal variations in the number of particles. Furthermore, the selection part 44 outputs the time-series measured value of the number of particles for each selected mass to the determination part 45.

Even in the present embodiment, the numbers of particles during the etching process vary, for example, as illustrated in FIGS. 8A and 8B. However, in the present embodiment, the horizontal axis of FIGS. 8A and 8B represents mass. Further, in FIGS. 8A and 8B when the horizontal axis is mass, when variations in the number of particles of masses X, Y, and Z are larger than variations in the number of particles of other masses, the masses X, Y, and Z are selected by the selection part 44.

In the present embodiment, the determination part 45 determines an operation expression based on the number of particles of each selected mass immediately after the start of the etching process and the number of particles of each selected mass immediately before the end of the etching process. Furthermore, the determination part 45 determines a switching condition based on the number of particles immediately before the end of the etching process.

Even in the present embodiment, the operation expression is determined, for example, as in Equation (2) described above. However, in the present embodiment, A(m) denotes the number of particles of an m-th mass having a decreasing number of particles with the progress of the etching process, and $A(m)_{max}$ denotes a maximum value of the number of particles in the section from 0 to 60. Furthermore, B (m) denotes the number of particles having an n-th mass having an increasing number of particles with the progress of the etching process, and $B(m)_{min}$ denotes a minimum value of the number of particles in the section from 0 to 60. In addition, m and n are natural numbers satisfying n+m=monitoring number.

Assuming that the numbers of particles having the masses X, Y, and Z vary as illustrated in FIG. 9 when the vertical axis is the number of particles, the operation expression is determined, for example, as in Equation (3) described above even in the present embodiment.

Furthermore, even in the present embodiment, the determination part 45 determines, as the switching condition, a condition under which the value E of the determined operation expression becomes a value that falls within a predetermined range centered on an average value in the section from 75 to 80 immediately before the end of the etching process. In addition, when the average value of the value E of the operation expression in the section from 0 to 60 immediately after the start of the etching process is set to be 0% and the average value of the value E of the operation expression in the section from 75 to 80 immediately before the end of the etching process is set to be 100%, a condition under which the value E of the determined operation expression becomes a value that falls within a range of 90% or more and 100% or less may be determined as the switching condition.

[Processing of Support Device 40]

Figure 16:
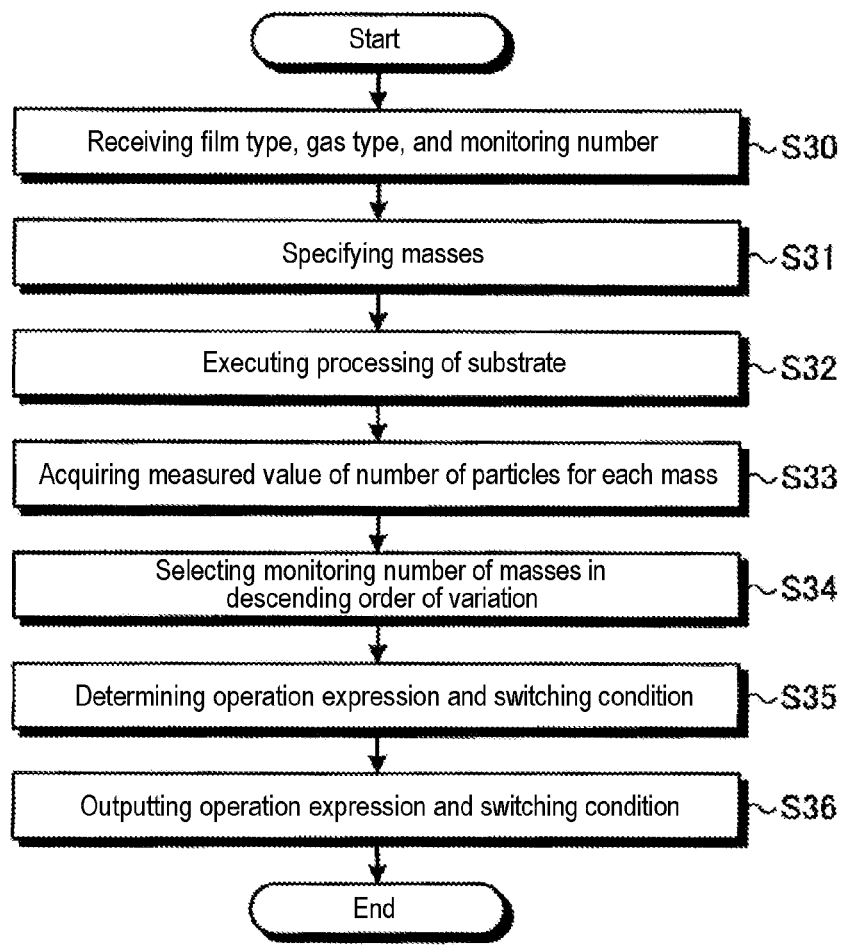
FIG. 16 is a flowchart illustrating an example of a processing of a support device according to the second embodiment.

FIG. 16 is a flowchart illustrating an example of a processing of the support device 40 according to the second embodiment. The processing illustrated in FIG. 16 is performed for each process condition.

First, the reception part 41 receives, from the user of the substrate processing system 1, the type of the film to be processed, the type of the gas used for the processing, and the monitoring number (S30). Further, the reception part 41 outputs the received information to the specifying part 42.

Subsequently, the specifying part 42 specifies masses of particles generated during the processing for the film of the type received by the reception part 41 and masses of particles included in the gas corresponding to the gas type received by the reception part 41, by referring to the DB 400 (S31). Further, the specifying part 42 outputs information on the specified masses to the acquisition part 43.

Subsequently, the acquisition part 43 causes the substrate processing apparatus 20a to experimentally perform the processing for the substrate W based on the recipe (S32). In the processing for the substrate W experimentally performed, the substrate W having the same configuration as the substrate W used in the actual processing is used.

Subsequently, the acquisition part 43 instructs the measuring device 30b to measure the number of particles for each mass of the particles specified by the specifying part 42. Further, the acquisition part 43 acquires a measured value of the number of particles for each mass as the measured value of the amount of particles contained in the gas in the chamber 21, from the measuring device 30b (S33). Furthermore, the acquisition part 43 outputs information on the number of particles for each mass to the selection part 44.

Subsequently, the selection part 44 accumulates the measured value of the number of particles output from the acquisition part 43 for each mass specified by the specifying part 42 in a time series manner until the processing is completed. Further, the selection part 44 selects, among the masses of which numbers of particles have been measured, masses corresponding to the monitoring number received by the reception part 41 in descending order of temporal variations in the number of particles (S34). Furthermore, the selection part 44 outputs the time-series measured values of the number of particles for each selected mass to the determination part 45.

Subsequently, the determination part 45 determines an operation expression and a switching condition for determining the switching timing based on a temporal change in the number of particles for each selected mass (S35).

Subsequently, the output part 46 outputs the determined operation expression and switching condition to the substrate processing apparatus 20b (S36). Then, the support device 40 terminates the processing illustrated in the flowchart of FIG. 16.

[Processing of Substrate Processing Apparatus 20b]

The processing of the substrate processing apparatus 20b according to the present embodiment is identical to the processing of the substrate processing apparatus 20a illustrated in FIG. 12 except for the points described below, and therefore, an illustration thereof will be omitted.

At step S22, the calculation part 280 instructs the measuring device 30b to measure the number of particles for each mass included in the operation expression. Further, the calculation part 280 acquires the measured value of the number of particles for each mass from the measuring device 30b.

At step S23, the calculation part 280 calculates the value E of the operation expression based on the measured value of the number of particles for each mass.

The second embodiment has been described above. As described above, in the present embodiment, the properties of the particles are masses of the particles. Furthermore, the specifying part 42 specifies the masses of particles generated when the processing for the film of the type received by the reception part 41 is performed, and the masses of particles contained in the gas corresponding to the gas type received by the reception part 41, by referring to the DB 400. Furthermore, the acquisition part 43 acquires the measured value of the number of particles for each mass of particles specified by the specifying part 42 as the measured value of the amount of particles contained in the gas in the substrate processing apparatus 20b, from the measuring device 30b. The selection part 44 selects, among the masses of particles, masses of a predetermined number of particles in descending order of the temporal variations in the number of particles. The determination part 45 determines the operation expression and the switching condition for determining the switching timing based on the temporal change in the number of particles for each selected mass of the particles. The calculation part 280 calculates the value E of the operation expression based on the number of particles measured for each mass of particles included in the operation expression. Thus, the switching timing of the processing can be specified even in the processing without using plasma.

Furthermore, in the aforementioned embodiment, the reception part 41 further receives the monitoring number of that indicates the number of masses of particles to be monitored. The selection part 44 selects, among the masses of which numbers of particles have been measured, masses corresponding to the monitoring number received by the reception part 41 in descending order of the temporal variations in the number of particles. Thus, it is possible to reduce the processing load of the support device 40.

OTHERS

The technique disclosed herein is not limited to the aforementioned embodiments but many modifications may be made without departing the spirit of the present disclosure.

For example, when the processing for the substrate W is performed based on a recipe including a processing using plasma and a processing without using plasma, the first embodiment and the second embodiment may be combined. For example, in the recipe, the operation expression and the switching condition determined by the first embodiment are used for the processing using plasma, and the operation expression and the switching condition determined by the second embodiment are used for the processing without using plasma.

Furthermore, even in the processing using plasma, the substrate processing system 1 according to the second embodiment may be used. Therefore, even when the window 21w becomes cloudy due to a reaction byproduct or the like generated in the chamber 21 during the plasma processing, the switching timing of the processing can be accurately specified.

Moreover, in each of the aforementioned embodiments, the reception part 41 receives the monitoring number from the user of the substrate processing system 1, but the disclosed technique is not limited thereto and the monitoring number may be a fixed value.

Furthermore, in the aforementioned embodiments, the specifying part 42 specifies the wavelengths of light or the masses of particles according to the film type and the gas type, which are received via the reception part 41, by referring to the DB 400, but the disclosed technique is not limited thereto. The reception part 41 may receive, from the user, the wavelengths of light or the masses of particles according to the film to be processed and the gas used for the processing, and output the same to the acquisition part 43. In addition, the specifying part 42 may specify the wavelengths of light or the masses of particles according to the film to be processed or the gas used for the processing from the actually measured values without referring to the DB 400.

Furthermore, in the aforementioned embodiments, the instruction part 281 of the substrate processing apparatus 20a or of the substrate processing apparatus 20b determines the switching timing of the processing by using the switching condition determined by the determination part 45 of the support device 40. However, the disclosed technique is not limited thereto. For example, the support device 40 may present the time-series data of the value E of the operation expression determined by the determination part 45 and the switching condition determined by the determination part 45 to the user of the substrate processing system 1 via a display device or the like connected to the support device 40. At this time, the support device 40 may receive a switching condition finely adjusted by the user of the substrate processing system 1 via an input device or the like connected to the support device 40, and may output the finely adjusted switching condition together with the operation expression to the substrate processing apparatus 20a or the substrate processing apparatus 20b.

Furthermore, in the aforementioned embodiments, there has been described the substrate processing system 1 that performs a processing using capacitively coupled plasma (CCP) as an example of the plasma source, but the plasma source is not limited thereto. Examples of plasma sources other than capacitively coupled plasma may include inductively coupled plasma (ICP), microwave excited surface wave plasma (SWP), electron cyclotron resonance plasma (ECP), helicon wave excited plasma (HWP), and the like.

According to the present disclosure in some embodiments, it is possible to improve accuracy of a switching timing of a processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system, comprising:
a substrate processing apparatus configured to execute a processing for a substrate based on a recipe in which process conditions for each of a plurality of processings for the substrate are specified; and
a switching timing creation support device configured to support creation of a switching timing of the processing for the substrate,
wherein the switching timing creation support device comprises:
an acquisition part configured to cause the substrate processing apparatus to execute the processing for the substrate based on the recipe, and to acquire, for each of a plurality of properties of particles including atoms and molecules contained in a gas in the substrate processing apparatus during the execution of the processing, a measured value of an amount of the particles from a measuring device that measures the amount of the particles contained in the gas;
a selection part configured to select, among the properties of the particles, properties of a predetermined number of the particles in descending order of temporal variations in the amount of the particles;
a determination part configured to determine an operation expression and a switching condition for determining the switching timing based on a temporal change in the amount of the particles for each of the selected properties of the predetermined number of the particles; and
an output part configured to output the operation expression and the switching condition to the substrate processing apparatus, and
wherein the substrate processing apparatus comprises:
an execution part configured to execute the processing for the substrate based on the recipe;
a calculation part configured to calculate a value of the operation expression based on the amount of the particles measured by the measuring device for each of the properties of the particles included in the operation expression; and
an instruction part configured to instruct the execution part to switch the process conditions when the value of the operation expression satisfies the switching condition.

2. The substrate processing system of claim 1, wherein the switching timing creation support device further comprises:
a reception part configured to receive a type of a film to be processed and a type of a gas used for the processing;
a specifying part configured to specify, by referring to a database in which properties of particles generated in a processing using a film and a gas are stored in association with a type of the film and a type of the gas, respectively, properties of particles contained in the gas in the substrate processing apparatus when the processing for the film of the type received by the reception part is performed and properties of the particles contained in the gas corresponding to the type of gas received by the reception part, and
wherein the acquisition part is configured to acquire a measured value of the amount of the particles contained in the gas in the substrate processing apparatus for each of the properties of the particles specified by the specifying part, from the measuring device.

3. The substrate processing system of claim 2, wherein the execution part of the substrate processing apparatus is configured to execute an etching process using plasma as the processing for the substrate,
wherein the film to be processed is an etching target film, and
wherein the gas used for the processing is an etching gas.

4. The substrate processing system of claim 3, wherein the properties of the particles are wavelengths of light observed in emission of the particles,
wherein the specifying part is configured to specify, by referring to the database, wavelengths of light observed in emission of the particles generated when the processing for the film of the type received by the reception part is performed, and wavelengths of light observed in emission of the particles contained in the gas corresponding to the type of gas received by the reception part, wherein the acquisition part is configured to acquire, for each of the wavelengths of light observed in the emission of the particles specified by the specifying part, a measured value of an emission intensity observed in the emission of the particles as the measured value of the amount of the particles contained in the gas in the substrate processing apparatus, from the measuring device, wherein the selection part is configured to select, among the wavelengths of which emission intensities have been measured, wavelengths of a predetermined number in descending order of temporal variations in emission intensity, wherein the determination part is configured to determine the operation expression and the switching condition for determining the switching timing based on a temporal change in the emission intensity for each of the selected wavelengths, and wherein the calculation part is configured to calculate the value of the operation expression based on the emission intensity measured for each of the wavelengths included in the operation expression.

5. The substrate processing system of claim 4, wherein the reception part is further configured to receive a monitoring number that indicates the number of wavelengths of light observed in the emission of the particles to be monitored, and wherein the selection part is configured to select, among the wavelengths of which emission intensities have been measured, wavelengths corresponding to the monitoring number received by the reception part in descending order of the temporal variations in emission intensity.

6. The substrate processing system of claim 3, wherein the properties of the particles are masses of the particles, wherein the specifying part is configured to specify, by referring to the database, masses of the particles generated when the processing for the film of the type received by the reception part is performed, and masses of the particles contained in the gas corresponding to the type of gas received by the reception part, wherein the acquisition part is configured to acquire, for each of the masses of the particles specified by the specifying part, a measured value of the number of the particles as the measured value of the amount of the particles contained in the gas in the substrate processing apparatus, from the measuring device, wherein the selection part is configured to select, among the masses of the particles of which numbers of particles have been measured, masses of a predetermined number in descending order of temporal variations in the number of the particles, wherein the determination part is configured to determine the operation expression and the switching condition for determining the switching timing based on a temporal change in the number of the particles for each of the selected masses of the particles, and wherein the calculation part is configured to calculate the value of the operation expression based on the number of particles measured for each of the masses of the particles included in the operation expression.

7. The substrate processing system of claim 6, wherein the reception part is further configured to receive a monitoring number that indicates the number of masses of the particles to be monitored, and wherein the selection part is configured to select, among the masses of the particles of which numbers of the particles have been measured, masses of the particles corresponding to the monitoring number received by the reception part in descending order of the temporal variations in the number of particles.

8. The substrate processing system of claim 2, wherein the properties of the particles are wavelengths of light observed in emission of the particles, wherein the specifying part is configured to specify, by referring to the database, wavelengths of light observed in emission of the particles generated when the processing for the film of the type received by the reception part is performed, and wavelengths of light observed in emission of the particles contained in the gas corresponding to the type of gas received by the reception part, wherein the acquisition part is configured to acquire, for each of the wavelengths of light observed in the emission of the particles specified by the specifying part, a measured value of an emission intensity observed in the emission of the particles as the measured value of the amount of the particles contained in the gas in the substrate processing apparatus, from the measuring device, wherein the selection part is configured to select, among the wavelengths of which emission intensities have been measured, wavelengths of a predetermined number in descending order of temporal variations in emission intensity, wherein the determination part is configured to determine the operation expression and the switching condition for determining the switching timing based on a temporal change in the emission intensity for each of the selected wavelengths, and wherein the calculation part is configured to calculate the value of the operation expression based on the emission intensity measured for each of the wavelengths included in the operation expression.

9. The substrate processing system of claim 2, wherein the properties of the particles are masses of the particles, wherein the specifying part is configured to specify, by referring to the database, masses of the particles generated when the processing for the film of the type received by the reception part is performed, and masses of the particles contained in the gas corresponding to the type of gas received by the reception part, wherein the acquisition part is configured to acquire, for each of the masses of the particles specified by the specifying part, a measured value of the number of the particles as the measured value of the amount of the particles contained in the gas in the substrate processing apparatus, from the measuring device, wherein the selection part is configured to select, among the masses of the particles of which numbers of particles have been measured, masses of a predetermined number in descending order of temporal variations in the number of the particles, wherein the determination part is configured to determine the operation expression and the switching condition for determining the switching timing based on a temporal change in the number of the particles for each of the selected masses of the particles, and wherein the calculation part is configured to calculate the value of the operation expression based on the number of particles measured for each of the masses of the particles included in the operation expression.

10. A switching timing creation support device, comprising:
an acquisition part configured to cause a substrate processing apparatus to execute a processing for a substrate based on a recipe in which process conditions for each of a plurality of processings for the substrate are specified, and to acquire, for each of a plurality of properties of particles including atoms and molecules contained in a gas in the substrate processing apparatus during the execution of the processing, a measured value of an amount of the particles from a measuring device that measures the amount of the particles contained in the gas;
a selection part configured to select, among the properties of the particles, properties of a predetermined number of the particles in descending order of temporal variations in the amount of the particles;
a determination part configured to determine an operation expression and a switching condition for determining a switching timing of the processing based on a temporal change in the amount of the particles for each of the selected properties of the predetermined number of the particles; and
an output part configured to output the operation expression and the switching condition to the substrate processing apparatus.

11. The switching timing creation support device of claim 10, further comprising:
a reception part configured to receive a type of a film to be processed and a type of a gas used for the processing; and
a specifying part configured to specify, by referring to a database in which properties of particles generated in a processing using a film and a gas are stored in association with a type of the film and a type of the gas, respectively, properties of particles contained in the gas in the substrate processing apparatus when the processing for the film of the type received by the reception part is performed, and properties of the particles contained in the gas corresponding to the type of gas received by the reception part,
wherein the acquisition part is configured to acquire a measured value of the amount of the particles contained in the gas in the substrate processing apparatus for each of the properties of the particles specified by the specifying part, from the measuring device.

12. The switching timing creation support device of claim 11, wherein the substrate processing apparatus is configured to execute an etching process using plasma as the processing for the substrate,
wherein the film to be processed is an etching target film, and
wherein the gas used for the processing is an etching gas.

13. The switching timing creation support device of claim 11, wherein the properties of the particles are wavelengths of light observed in emission of the particles,
wherein the specifying part is configured to specify, by referring to the database, wavelengths of light observed in emission of the particles generated when the processing for the film of the type received by the reception part is performed, and wavelengths of light observed in emission of the particles contained in the gas corresponding to the type of gas received by the reception part,
wherein the acquisition part is configured to acquire, for each of the wavelengths of light observed in the emission of the particles specified by the specifying part, a measured value of an emission intensity observed in the emission of the particles as the measured value of the amount of the particles contained in the gas in the substrate processing apparatus, from the measuring device,
wherein the selection part is configured to select, among the wavelengths of which emission intensities have been measured, wavelengths of a predetermined number in descending order of temporal variations in emission intensity, and
wherein the determination part is configured to determine the operation expression and the switching condition for determining the switching timing based on a temporal change in the emission intensity for each of the selected wavelengths.

14. The switching timing creation support device of claim 11, wherein the properties of the particles are masses of the particles,
wherein the specifying part is configured to specify, by referring to the database, masses of the particles generated when the processing for the film of the type received by the reception part is performed, and masses of the particles contained in the gas corresponding to the type of gas received by the reception part,
wherein the acquisition part is configured to acquire, for each of the masses of the particles specified by the specifying part, a measured value of the number of the particles as the measured value of the amount of the particles contained in the gas in the substrate processing apparatus, from the measuring device,
wherein the selection part is configured to select, among the masses of the particles of which numbers of particles have been measured, masses of a predetermined number in descending order of temporal variations in the number of the particles, and
wherein the determination part is configured to determine the operation expression and the switching condition for determining the switching timing based on a temporal change in the number of the particles for each of the selected masses of the particles.

15. A switching timing creation support method, comprising:
an acquiring process of causing a substrate processing apparatus to execute a processing for a substrate based on a recipe in which process conditions for each of a plurality of processings for the substrate are specified, and to acquire, for each of a plurality of properties of the particles including atoms and molecules contained in a gas in the substrate processing apparatus during the execution of the processing, a measured value of an amount of the particles from a measuring device that measures the amount of the particles contained in the gas;
a selection process of selecting, among the properties of the particles, properties of a predetermined number of the particles in descending order of temporal variations in the amount of the particles;
a determination process of determining an operation expression and a switching condition for determining a switching timing of the processing based on a temporal change in the amount of the particles for each of the selected properties of the predetermined number of the particles; and an output process of outputting the operation expression and the switching condition to the substrate processing apparatus.

16. The switching timing creation support method of claim 15, further comprising:

a reception process of receiving a type of a film to be processed and a type of a gas used for the processing; and a specifying process of specifying, by referring to a database in which properties of particles generated in the processing using a film and a gas are stored in association with a type of the film and a type of the gas, respectively, properties of particles contained in the gas in the substrate processing apparatus when the processing for the film of the type received in the reception process is performed, and properties of the particles contained in the gas corresponding to the type of gas received in the reception process, wherein the acquiring process includes acquiring a measured value of the amount of the particles contained in the gas in the substrate processing apparatus for each of the properties of the particles specified in the specifying process, from the measuring device.

17. The switching timing creation support method of claim 16, wherein the substrate processing apparatus is configured to execute an etching process using plasma as the processing for the substrate, wherein the film to be processed is an etching target film, and wherein the gas used for the processing is an etching gas.

18. The switching timing creation support method of claim 16, wherein the properties of the particles are wavelengths of light observed in emission of the particles, and wherein the specifying process includes specifying, by referring to the database, wavelengths of light observed in emission of the particles generated when the processing for the film of the type received in the reception process is performed, and wavelengths of light observed in emission of the particles contained in the gas corresponding to the type of gas received in the reception process, wherein the acquiring process includes acquiring, for each of the wavelengths of light observed in the emission of the particles specified in the specifying process, a measured value of an emission intensity observed in the emission of the particles as the measured value of the amount of the particles contained in the gas in the substrate processing apparatus, from the measuring device, wherein the selection process includes selecting, among the wavelengths of which emission intensities have been measured, wavelengths of a predetermined number in descending order of temporal variations in emission intensity, and wherein the determination process includes determining the operation expression and the switching condition for determining the switching timing based on a temporal change in the emission intensity for each of the selected wavelengths.

19. The switching timing creation support method of claim 16, wherein the properties of the particles are masses of the particles, wherein the specifying process includes specifying, by referring to the database, masses of the particles generated when the processing for the film of the type received in the reception process is performed, and masses of the particles contained in the gas corresponding to the type of gas received in the reception process, wherein the acquiring process includes acquiring, for each of the masses of the particles specified in the specifying process, a measured value of the number of the particles as the measured value of the amount of the particles contained in the gas in the substrate processing apparatus, from the measuring device, wherein the selection process includes selecting, among the masses of the particles of which number of particles have been measured, masses of a predetermined number in descending order of temporal variations in the number of the particles, and wherein the determination process includes determining the operation expression and the switching condition for determining the switching timing based on a temporal change in the number of the particles for each of the selected masses of the particles.

20. A substrate processing apparatus for executing a processing for a substrate based on a recipe in which process conditions for each of a plurality of processings for the substrate are specified, the apparatus comprising:

an execution part configured to execute the processing for the substrate based on the recipe;

a calculation part configured to calculate a value of an operation expression based on an amount of particles measured by a measuring device for each of a plurality of properties of the particles included in the operation expression received from a switching timing creation support device; and an instruction part configured to instruct the execution part to switch the process conditions when the value of the operation expression satisfies a switching condition, wherein the switching timing creation support device is configured to:

acquire, for each of the properties of the particles including atoms and molecules contained in a gas in the substrate processing apparatus during the execution of the processing for the substrate based on the recipe by the execution part, a measured value of the amount of the particles from the measuring device that measures the amount of the particles contained in the gas;

select, among the properties of the particles, properties of a predetermined number of the particles in descending order of temporal variations in the amount of the particles; and determine the operation expression and the switching condition for determining a switching timing of the processing for the substrate based on a temporal change in the amount of the particles for each of the selected properties of the predetermined number of the particles, and wherein the substrate processing apparatus receives the determined operation expression and switching condition from the switching timing creation support device.

* * * * *